United States Patent
Masuda et al.

(10) Patent No.: US 7,565,582 B2
(45) Date of Patent: Jul. 21, 2009

(54) CIRCUIT FOR TESTING THE AC TIMING OF AN EXTERNAL INPUT/OUTPUT TERMINAL OF A SEMICONDUCTOR INTEGRATED CIRCUIT

(75) Inventors: Tomomitsu Masuda, Osaka (JP); Hiroshi Sonobe, Osaka (JP); Masayuki Motohama, Osaka (JP); Keisuke Kodera, Osaka (JP)

(73) Assignee: Panasonic Corporation, Osaka (JP)

( * ) Notice: Subject to any disclaimer, the term of this patent is extended or adjusted under 35 U.S.C. 154(b) by 319 days.

(21) Appl. No.: 11/650,471

(22) Filed: Jan. 8, 2007

(65) Prior Publication Data
US 2007/0257707 A1    Nov. 8, 2007

(30) Foreign Application Priority Data
Mar. 20, 2006   (JP)   ............................. 2006-076272

(51) Int. Cl.
G11B 20/20    (2006.01)
G01R 31/28    (2006.01)

(52) U.S. Cl. ....................................... 714/700; 714/724

(58) Field of Classification Search ................. 714/700, 714/731, 738, 744, 74
See application file for complete search history.

(56) References Cited

U.S. PATENT DOCUMENTS

| 6,073,260 A * | 6/2000 | Kurita .......................... 714/724 |
| 6,477,674 B1 * | 11/2002 | Bates et al. .................. 714/738 |
| 6,629,274 B1 * | 9/2003 | Tripp et al. .................. 714/721 |
| 7,078,928 B2 * | 7/2006 | Sahara et al. ................. 326/16 |
| 7,210,074 B2 * | 4/2007 | Mc Auliffe .................. 714/700 |
| 7,363,551 B2 * | 4/2008 | Muljono ...................... 714/700 |

FOREIGN PATENT DOCUMENTS

JP    2001-221834 A    8/2001

* cited by examiner

Primary Examiner—James C Kerveros
(74) Attorney, Agent, or Firm—McDermott Will & Emery LLP

(57) ABSTRACT

In a semiconductor integrated circuit, one of two signals generated from a first logic circuit is delayed in a first delay addition circuit, looped back by an input/output terminal, and then inputted to a second logic circuit. The other output of the first logic circuit is looped back by a reference input/output terminal, further delayed in a second delay addition circuit, and then inputted to the second logic circuit. By varying respective amounts of delay added by the first and second delay addition circuits from each other, AC timing specifications are satisfied and it is determined whether or not the semiconductor integrated circuit has passed a test based on whether or not the output of the second logic circuits is a desired signal relative to the input of the first logic circuit.

6 Claims, 6 Drawing Sheets

CIRCUIT FOR TESTING THE AC TIMING OF AN EXTERNAL INPUT/OUTPUT TERMINAL OF A SEMICONDUCTOR INTEGRATED CIRCUIT

CROSS REFERENCE TO RELATED APPLICATION

The teachings of Japanese Patent Application JP 2006-076272, filed Mar. 20, 2006, are entirely incorporated herein by reference, inclusive of the specification, drawings, and claims.

BACKGROUND OF THE INVENTION

1. Field of the Invention

The present invention relates to a semiconductor integrated circuit comprising a circuit for testing and evaluating the AC timing of an external input/output terminal of a semiconductor integrated circuit.

2. Description of the Prior Art

In recent years, as the progress of semiconductor technologies has enabled semiconductor integrated circuits to operate at higher speeds, external input/output signals have been supplied at increasingly higher speeds to and from the external input/output terminals of the semiconductor integrated circuits. In such semiconductor integrated circuits operating at increasingly high speeds, an AC timing test on external input/output signals has become increasingly important as a mass-production shipment test.

For example, in the case of testing an AC timing using an input signal from the outside of a semiconductor integrated circuit as a reference, the AC timing can be tested by setting a test signal outputted from an LSI tester to a specified timing relative to the timing to which the reference input signal has been set.

By contrast, in the case of testing an AC timing using an output signal from a semiconductor integrated circuit as a reference, the AC timing can be tested by retrieving the transition point of the reference output signal by means of an LSI tester and setting the timing for determination by the LSI tester relative to the transition point such that it satisfies specifications.

There is also a semiconductor integrated circuit comprising an AC timing test circuit having, e.g., a timing test circuit and a self-diagnostic circuit, which uses an output signal to one external output terminal thereof as a reference to test the AC timing of an output signal to another external output terminal (see, e.g., Japanese Laid-Open Patent Publication No. 2001-221834).

In an AC timing test as described above, it is necessary to use an LSI tester capable of operating at a speed higher than the operating speed of an external input/output terminal. Accordingly, as the operating speed of a semiconductor integrated circuit has become higher, an LSI tester which satisfies increasingly higher-speed specifications has been in growing demand. However, because an LSI tester which satisfies higher-speed specifications is generally higher in cost, the use of a higher-cost LSI tester leads to an increase in testing cost. For this reason, in an LSI test during mass production, it is requested to perform an AC timing test on an external input/output terminal by using an LSI tester lower in operating speed than the external input/output terminal.

To satisfy the request, the above-mentioned semiconductor integrated circuit comprising the AC timing test circuit allows an LSI test using an LSI tester lower in operating speed than the external input/output terminal. However, the semiconductor integrated circuit with the AC timing test circuit has been proposed to perform the test on an output signal and it cannot perform the test on an input signal.

SUMMARY OF THE INVENTION

The present invention has been achieved in view of the problem mentioned above and it is therefore an object of the present invention to provide a semiconductor integrated circuit which allows an AC timing test to be performed on each of an output signal and an input signal at an external input/output terminal by using an LSI tester lower in operating speed than the external input/output terminal.

To solve the problem mentioned above, an aspect of the present invention is a semiconductor integrated circuit comprising: a first logic circuit for outputting an output signal in accordance with an operation pattern input signal inputted thereto; a first delay addition circuit for delaying the output of the first logic circuit by an amount of delay in accordance with a first delay addition signal inputted thereto and outputting the delayed output; an input/output terminal for outputting the output of the first delay addition circuit; a reference input/output terminal for outputting the output of the first logic circuit; a second delay addition circuit for delaying a signal inputted thereto by an amount of delay in accordance with a second delay addition signal inputted thereto and outputting the delayed signal; and a second logic circuit for outputting an operation pattern output signal in accordance with two input signals, wherein the second delay addition circuit receives the output of the first logic circuit which has been looped back from the reference input/output terminal and the second logic circuit receives, as one of the two input signals, the output of the first delay addition circuit which has been looped back from the input/output terminal and receives, as the other of the two input signals, the output of the second delay addition circuit.

The arrangement allows the second logic circuit to perform a logic operation by looping back the two signals generated from the first logic circuit at the input/output terminal and at the reference input/output terminal. As a result, by varying the respective amounts of delay added by the first and second delay addition circuits from each other and thereby causing the respective signals at the input/output terminal and the reference input/output terminal to satisfy AC timing specifications, an AC timing test can be performed on each of an output signal and an input signal at the external input/output terminal by using an LSI tester lower in operating speed than the external input/output terminal. In addition, the test can also be performed as a test on the actual speeds of the logic circuits.

DETAILED DESCRIPTION OF THE PREFERRED EMBODIMENTS

Figure 1:
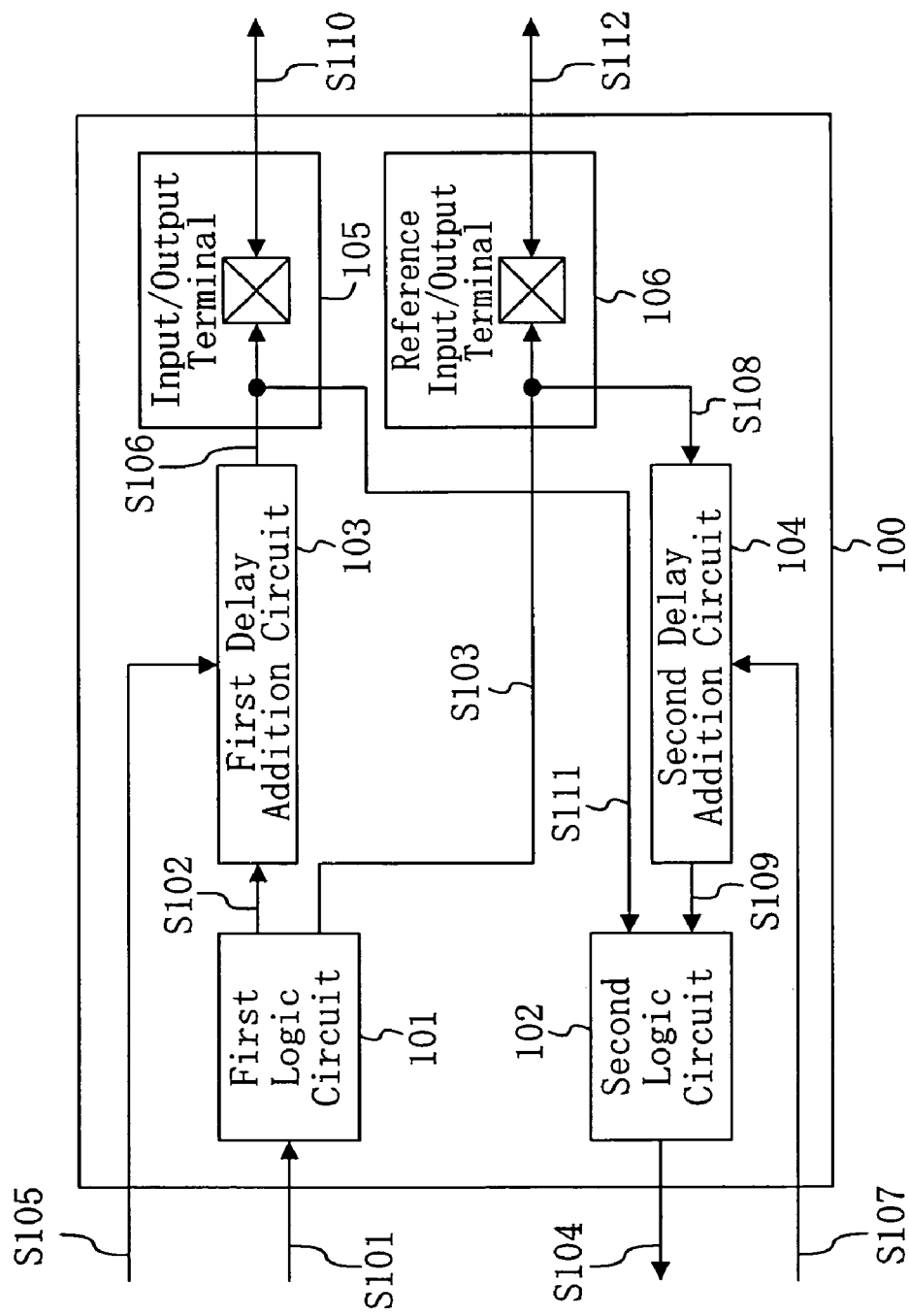
FIG. 1 is a block diagram showing a structure of a semiconductor integrated circuit according to a first embodiment of the present invention.

Referring to the drawings, the embodiments of the present invention will be described herein below. In the following description of the individual embodiments, the description of components having the same functions as the components that has been described once will be omitted by retaining the same reference numerals.

Embodiment 1

FIG. 1 is a block diagram showing a structure of a semiconductor integrated circuit 100 according to the first embodiment of the present invention. As shown in the drawing, the semiconductor integrated circuit 100 comprises: a first logic circuit 101; a second logic circuit 102; a first delay addition circuit 103; a second delay addition circuit 104; an input/output terminal 105; and a reference input/output terminal 106.

The first logic circuit 101 operates when input signals (operation pattern input signals S101) are inputted thereto and produces two outputs (an output signal S102 and a reference output signal S103) in accordance with the operation pattern input signals S101 to the first delay addition circuit 103 and the reference input/output terminal 106, respectively.

The second logic circuit 102 operates when two input signals are inputted thereto and outputs a signal (operation pattern output signal S104) in accordance with the input signals.

The first delay addition circuit 103 delays an output signal S102 from the first logic circuit 101 by an amount of delay indicated by a first delay addition signal S105 given thereto and outputs the delayed output signal S102 as a first delayed signal S106 to the input/output terminal 105.

The second delay addition circuit 104 delays a signal (reference input signal S108) inputted thereto via the reference input/output terminal 106 by an amount of delay indicated by a second delay addition signal S107 given thereto and outputs the delayed signal as a second delayed signal S109 to one of the inputs of the second logic circuit 102. The first and second delay addition signals S105 and S107 are inputted from, e.g., an LSI tester outside the semiconductor integrated circuit 100 or the like.

The input/output terminal 105 is for performing an input/output operation with the outside of the semiconductor integrated circuit 100. As described above, the input/output terminal 105 is connected to the output of the first delay addition circuit 103 and also connected to the other input of the second logic circuit 102 to loop back the output of the first delay addition circuit 103. A signal inputted or outputted to or from the input/output terminal 105 from or to the outside of the semiconductor integrated circuit 100 is termed an input/output signal S110 and the signal looped back by the input/output terminal 105 to the second logic circuit 102 is termed an input signal S111.

The reference input/output terminal 106 is for performing an input/output operation with the outside of the semiconductor integrated circuit 100. The reference input/output terminal 106 is connected to the output of the first logic circuit 101 and loops back the output of the first logic circuit 101 to the second delay addition circuit 104. A signal inputted or outputted to or from the reference input/output terminal 106 from or to the outside of the semiconductor integrated circuit 100 is termed a reference input/output signal S112.

The first delay addition signal S105, the second delay addition signal S107, the operation pattern input signals S101, and the operation pattern output signal S104 are lower in speed than signals at the input/output terminal 105 and at the reference input/output terminal 106. Accordingly, the first delay addition signal S105, the second delay addition signal S107, the operation pattern input signals S101, and the operation pattern output signal S104 can be handled in an LSI tester which is lower in speed than an LSI tester used in the case of directly testing the signals at the input/output terminal 105 and at the reference input/output terminal 106.

Next, a description will be given to an operation of the semiconductor integrated circuit 100 when an AC timing test is performed.

(AC Timing Test on Input/Output Signal S110 Using Inputted Reference Input/Output Signal S112)

A description will be given to an operation when an AC timing test is performed on the input/output signal S110 inputted to the input/output terminal 105 by using the reference input/output signal S112 inputted to the reference input/output terminal 106. In this test, an amount of delay added by the first delay addition circuit 103 is adjusted such that the first delayed signal S106 at the input/output terminal 105 and the reference output signal S103 at the reference input/output terminal 106 satisfy AC timing specifications. These signals are then looped back by the input/output terminal 105 and from the reference input/output terminal 106 to the second logic circuit 102. The looped-back signals are inputted to the second logic circuit 102 to operate it and, based on the output of the second logic circuit 102, it is determined whether or not the semiconductor integrated circuit 100 has passed the test.

First, the amount of delay added by the first delay addition circuit 103 is adjusted such that the input signal S111 and the reference input signal S108 satisfy the AC timing specifications in the vicinity of the input/output terminal 105 and the reference input/output terminal 106. For the adjustment, the operation pattern input signals S101 are first inputted to the first logic circuit 101 to operate it so that the output signal S102 and the reference output signal S103 are generated therefrom. Then, the delay time t of the signal transition point of the reference input/output signal S112 from the signal transition point of the input/output signal S110 is measured by using the LSI tester connected to the input/output terminal 105 and to the reference input/output terminal 106. At this time, the respective amounts of delay added by the first and second delay addition circuits 103 and 104 are set to values during a normal operation. The measurement of the delay time t may be performed appropriately by using signals at speeds lower than the actual speeds of the input/output terminal 105 and the reference input/output terminal 106.

Then, based on the measured delay time t, the first delay addition signal S105 is inputted to the first delay addition circuit 103 such that the first delayed signal S106 and the reference output signal S103 satisfy the AC timing specifications. At this time, the amount of delay added by the second delay addition circuit 104 is set to a value during the normal operation. As a result, the relationship between the reference input signal S108 looped back by the reference input/output terminal 106 and the input signal S111 looped back by the input/output terminal 105 satisfies the AC timing specifications in the vicinity of the terminals.

Next, an AC timing test is performed at an actual speed. For the AC timing test at an actual speed, the first logic circuit 101 is first operated with the operation pattern input signals S101 to generate the output signal S102 and the reference output signal S103. As a result, the first delay addition circuit S103 outputs the first delayed signal S106 obtained by delaying the output signal S102. The first delayed signal S106 is looped back by the input/output terminal 105 and inputted as the input signal S111 to the second logic circuit 102. The reference output signal S103 is looped back by the reference input/output terminal 106 and inputted as the reference input signal S108 to the second delay addition circuit 104. The second delay addition circuit 104 delays the reference input signal S108 inputted thereto and inputs the delayed reference input signal S108 as the second delayed signal S109 to the second logic circuit 102. As a result, the second logic circuit 102 outputs the operation pattern output signal S104 resulting from a logic operation performed at an actual speed. At this time, the operation pattern output signal S104 is checked in the LSI tester and, when the operation pattern output signal S104 has been outputted as desired data, it can be determined that the semiconductor integrated circuit 100 is an acceptable product which satisfies the AC timing specifications. When the desired data has not been outputted, it can be determined that the semiconductor integrated circuit 100 is a defective product.

(AC Timing Test on Reference Input/Output Signal S112 and Input/Output Signal S110 to be Outputted)

Next, a description will be given to an operation when an AC timing test is performed on the reference input/output signal S112 outputted from the reference input/output terminal 106 and on the input/output signal S110 outputted from the input/output terminal 105.

In the test, a delay time in a path from the input/output terminal 105 to the second logic circuit 102 and a delay time in a path from the reference input/output terminal 106 to the second logic circuit 102 are examined. The examination is performed by inputting signals (the input/output signal S110 and the reference input/output signal S112) which satisfy the AC timing specifications at the reference input/output terminal 106 and at the input/output terminal 105 to the input/output terminal 105 and to the reference input/output terminal 106 by using the LSI tester. Then, the second logic circuit 102 is caused to perform a logic operation and the second delay addition signal S107 is inputted to the second delay addition circuit 104 to set a delay to be added such that the operation pattern output signal S104 is outputted as desired data.

Subsequently, the AC timing test is performed at an actual speed. For the AC timing test, the operation pattern input signals S101 are first inputted to operate the first logic circuit 101. As a result, the first delay signal S106 is outputted to the input/output terminal 105 and the reference output signal S103 is outputted to the reference input/output terminal 106. The signal outputted to the input/output terminal 105 is looped back as the input signal S111 to the second logic circuit 102, while the signal outputted to the reference input/output terminal 106 is looped back as the reference input signal S108 to the second delay addition circuit 104.

The input/output signal S110 and the input signal S111 have the same AC timing at the input/output terminal 105, while the reference input/output signal S112 and the reference input signal S108 have the same AC timing at the input/output terminal 105.

Accordingly, as a result of checking the operation pattern output signal S104 in the LSI tester, when it is found at this time that the operation pattern output signal S104 has been outputted as desired data, it is determined that the output of the semiconductor integrated circuit 100 satisfies the AC timing specifications and therefore the semiconductor integrated circuit 100 is an acceptable product. When the desired data has not been outputted, it can be determined that the semiconductor integrated circuit 100 is a defective product.

Thus, the present embodiment has caused the two signals generated in the first logic circuit 101 to satisfy the AC timing specifications by varying the respective amounts of delay added by the first and second delay addition circuits 103 and 104 from each other and also allowed the second logic circuit 102 to perform a logic operation by causing the input/output terminal 105 and the reference input/output terminal 106 to loop back the signals. This makes it possible to test the AC timing at a high speed in each of the output and input directions by using an LSI tester lower in operating speed than the external input/output terminal. In addition, the test can also be performed as a test on the actual speeds of logic circuits (the first logic circuit 101 and the second logic circuit 102).

When the AC timing test is performed by setting the delays to be added to various values, the margin evaluation of the semiconductor integrated circuit 100 can be performed.

Embodiment 2

Figure 2:
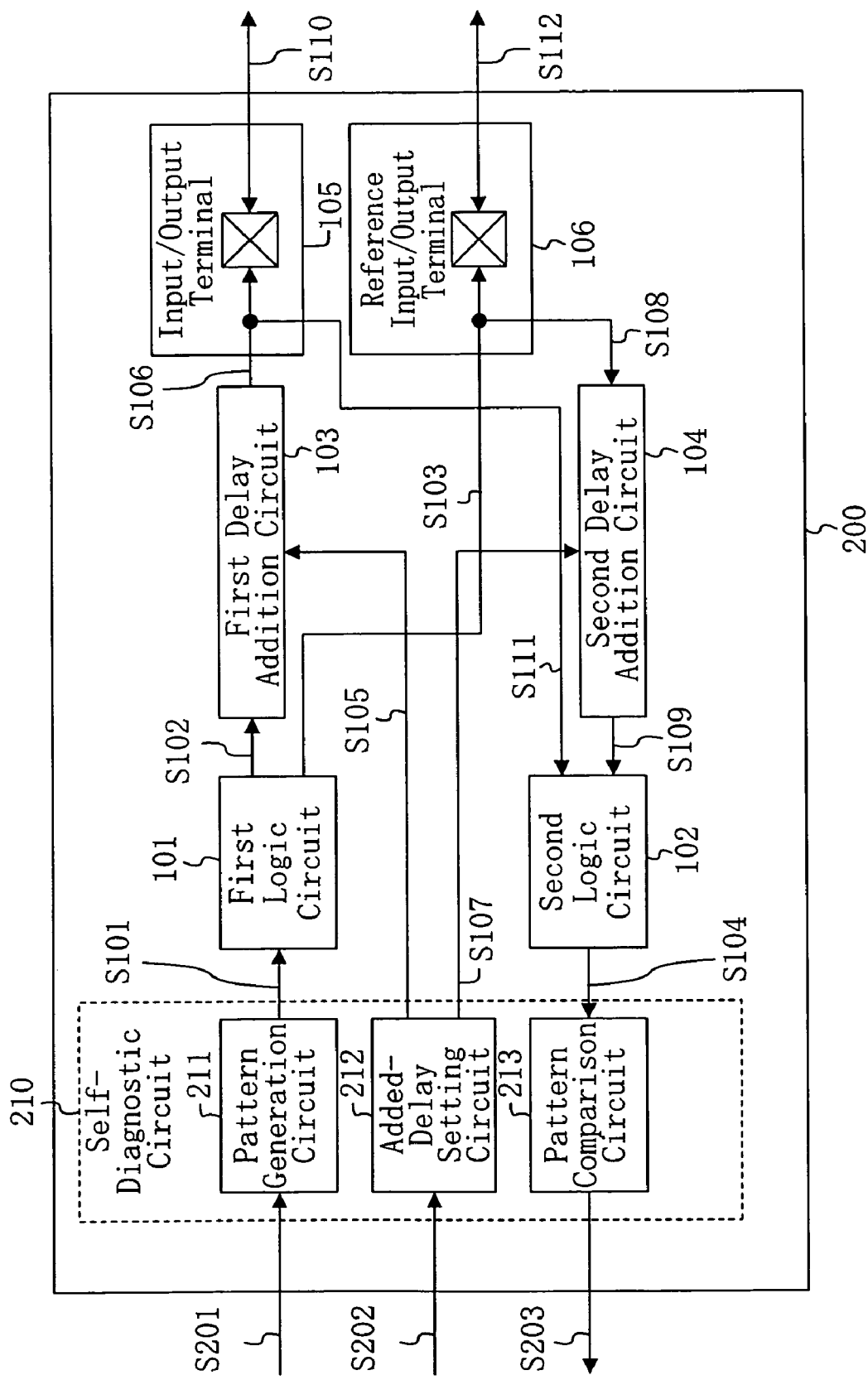
FIG. 2 is a block diagram showing a structure of a semiconductor integrated circuit according to a second embodiment of the present invention.

FIG. 2 is a block diagram showing a structure of a semiconductor integrated circuit 200 according to the second embodiment of the present invention. As shown in the drawing, a semiconductor integrated circuit 200 is constructed by adding a self-diagnostic circuit 210 to the semiconductor integrated circuit 100 according to the first embodiment.

The self-diagnostic circuit 210 is for performing an AC timing test as self diagnosis and comprises: a pattern generation circuit 211; an added-delay setting circuit 212; and a pattern comparison circuit 213.

The pattern generation circuit 211 receives a pattern generation start signal S210 as a trigger and generates the operation pattern input signals S101 in a pattern in accordance with the pattern generation start signal S201.

The added-delay setting circuit 212 receives an added delay setting signal S202 indicative of a delay setting condition (respective delays added by the first and second delay addition circuits 103 and 104) and outputs the first delay addition signal S105 for setting the delay to be added by the first delay addition circuit 103 and the second delay addition signal S107 for setting the delay to be added by the second delay addition circuit 104 in accordance with the inputted delay setting signal S202. Each of the pattern generation start signal S201 and the delay setting signal S202 mentioned above is inputted from, e.g., an LSI tester.

The pattern comparison circuit 213 compares the operation pattern output signal S104 outputted from the second logic circuit 102 with an expected value (a desired output corresponding to the operation pattern input signals S101) and outputs a determination signal S203 indicative of the result of the test. The output of the pattern comparison circuit 213 is connected to, e.g., the LSI tester.

To perform an AC timing test in the semiconductor integrated circuit 200, the pattern generation start signal S201 is inputted as a trigger to the pattern generation circuit 211, instead of inputting the operation pattern input signals S101 from the LSI tester as inputted in the first embodiment, and the delay setting signal S202 is inputted to the added-delay setting circuit 212 in place of the first and second delay addition signals S105 and S107. As a result, the determination signal S203 is outputted from the pattern comparison circuit 213.

Since the determination signal S203 indicates the result of the test, it allows easy determination of whether or not the semiconductor integrated circuit 200 has passed the test. In addition, since it is unnecessary to produce the complicated pattern (operation pattern input signals S101) for operating the first logic circuit 101 and make a determination on the complicated pattern (operation pattern output signal S104) outputted from the second logic circuit 102 in the LSI tester, the number of development steps can be reduced.

In the present embodiment also, the margin evaluation of the semiconductor integrated circuit 200 can be performed by, e.g., controlling the added-delay setting circuit 212 with the delay setting signal S202 and setting the delays to be added to various values.

Embodiment 3

In the semiconductor integrated circuit 200, the AC timing test (margin evaluation) can be performed by inputting the delay setting signal S202 in various patterns. However, to produce signals which satisfy the AC timing specifications to be evaluated, the setting using the delay setting signal S202 should be performed a large number of times. This leads to an increased number of steps in margin evaluation. To prevent this, the third embodiment of the present invention will describe an example of a semiconductor integrated circuit for which it is unnecessary to severally and repeatedly produce the delay setting signal S202 by using an LSI tester or the like.

Figure 3:
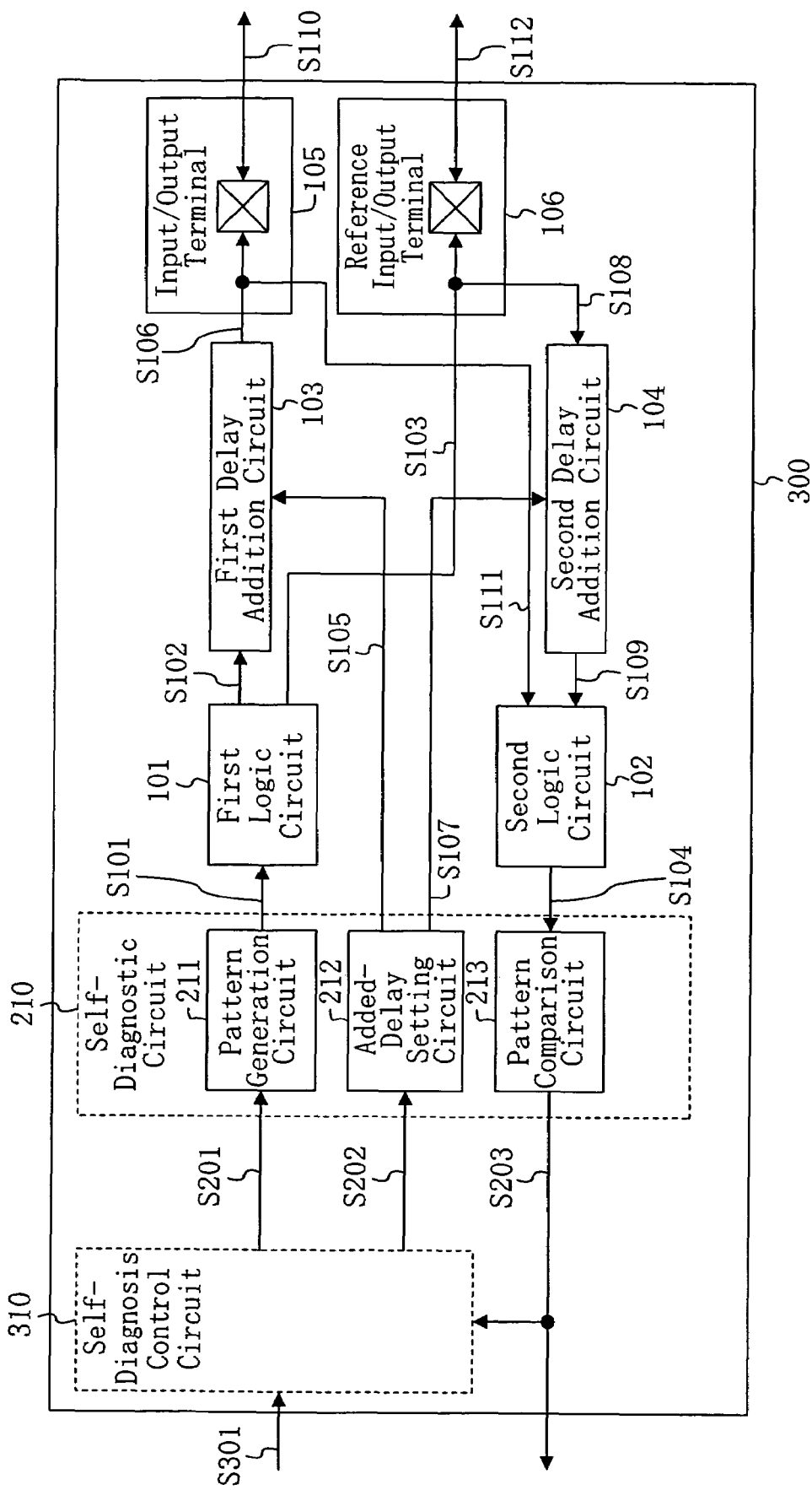
FIG. 3 is a block diagram showing a structure of a semiconductor integrated circuit according to a third embodiment of the present invention.

FIG. 3 is a block diagram showing a structure of a semiconductor integrated circuit 300 according to the third embodiment. As shown in the drawing, the semiconductor integrated circuit 300 is constructed by adding a self-diagnosis control circuit 310 to the semiconductor integrated circuit 200 according to the second embodiment.

The self-diagnosis control circuit 310 controls the self-diagnostic circuit 210 such that it performs an AC timing test under various delay setting conditions and starts an operation when an operation start signal S301 is inputted thereto. Specifically, the self-diagnosis control circuit 310 outputs the delay setting signal S202 to the added-delay setting circuit 212 such that it sets the delay to be added and then outputs the pattern generation start signal S201 to cause the pattern generation circuit 211 to output the operation pattern input signals S101, thereby causing the self-diagnostic circuit 210 to perform an AC timing test. When evaluation under one test condition is completed, the self-diagnosis control circuit 310 changes the delay setting signal S202 and outputs it in order to vary the delay setting condition (e.g., all the delays that can be set). For this purpose, the determination signal S203 has been inputted to the self-diagnosis control circuit 310 to detect the completion of the test.

Next, a description will be given to the margin evaluation of the AC timing in the semiconductor integrated circuit 300.

For example, when the operation start signal S301 is inputted from an LSI tester, the self-diagnosis control circuit 310 outputs the delay setting signal S202 to the added-delay setting circuit 212. As a result, the added-delay setting circuit 212 sets the respective amounts of delay added by the first and second delay addition circuits 103 and 104. Then, when the self-diagnosis control circuit 310 outputs the pattern generation start signal S201 to the pattern generation circuit 211, the pattern generation circuit 211 outputs the operation pattern input signals S101. In response to the operation pattern input signals S101, the first logic circuit 101 outputs the output signal S102 and the reference output signal S103. As a result, the signals are looped back from the input/output terminal 105 and the reference input/output terminal 106 and one of the looped-back signals is inputted to the second logic circuit 102, while the other looped-back signal is delayed in the second delay addition circuit 104 and then inputted to the second logic circuit 102. The second logic circuit 102 produces an output in accordance with the inputted signal. Then, the pattern comparison circuit 213 makes a PASS/FAIL determination on the output of the second logic circuit 102 and outputs the determination signal S203 indicative of the result of the determination. Since the determination signal S203 is outputted to the outside of the semiconductor integrated circuit 300, the result of the PASS/FAIL determination under the current delay setting condition can be seen by, e.g., checking the determination signal S203 in an LSI tester or the like.

The determination signal S203 is also inputted to the self-diagnosis control circuit 310 so that the self-diagnosis control circuit 310 senses the completion of evaluation under one test condition. Then, to change the delay setting condition, the self-diagnosis control circuit 310 newly outputs the delay setting signal S202 to the added-delay setting signal 212 and then further outputs the pattern generation start signal S201 to the pattern generation circuit 211. As a result, the self-diagnostic circuit 210 performs evaluation under another delay setting condition.

Thus, according to the present embodiment, the AC timing test (margin evaluation) is performed by automatically varying the amounts of delay to be added without severally and repeatedly generating the delay setting signal S202 in an LSI tester or the like Embodiment 4

In the semiconductor integrated circuit 300 described above, it is necessary to constantly monitor the relationship between the set delay values and the result of the determination in the test so that, in margin evaluation, an increase in the number of patterns for monitoring is expected. To prevent this, the fourth embodiment of the present invention will describe an example of a semiconductor integrated circuit which does not need such monitoring.

Figure 4:
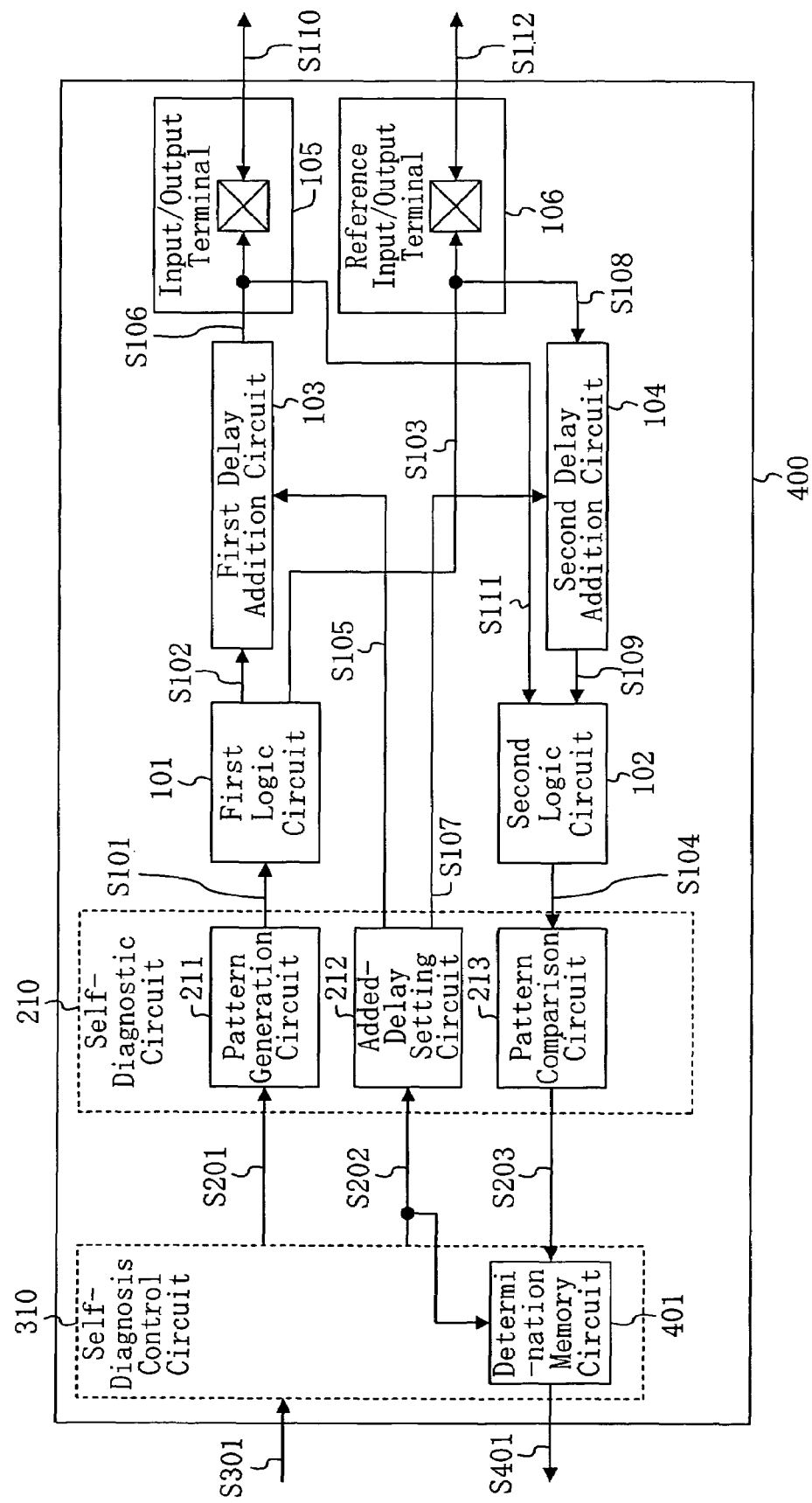
FIG. 4 is a block diagram showing a structure of a semiconductor integrated circuit according to a fourth embodiment of the present invention.

FIG. 4 is a block diagram showing a structure of a semiconductor integrated circuit 400 according to the fourth embodiment. As shown in the drawing, the semiconductor integrated circuit 400 is constructed by adding a determination memory circuit 401 to the self-diagnosis control circuit 310 according to the third embodiment.

The determination memory circuit 401 stores the result of the determination outputted from the pattern comparison circuit 213 in association with a delay setting condition and outputs the result of the determination stored therein as a pattern result read signal S401 in response to a request from the outside of the semiconductor integrated circuit 400.

In the semiconductor integrated circuit 300 according to the third embodiment, it is necessary to constantly monitor the relationship between the delay setting condition and the result of the determination during the AC timing test. Accordingly, when the number of patterns for setting delays for setting the AC timing is increased, the efficiency of the test may be degraded undesirably. By contrast, the present embodiment comprises the determination memory circuit 401 to allow the storage of the result of the AC timing test. As a result, it becomes possible to perform margin evaluation without constantly monitoring the result of the determination in the test during the timing test.

Embodiment 5

Figure 5:
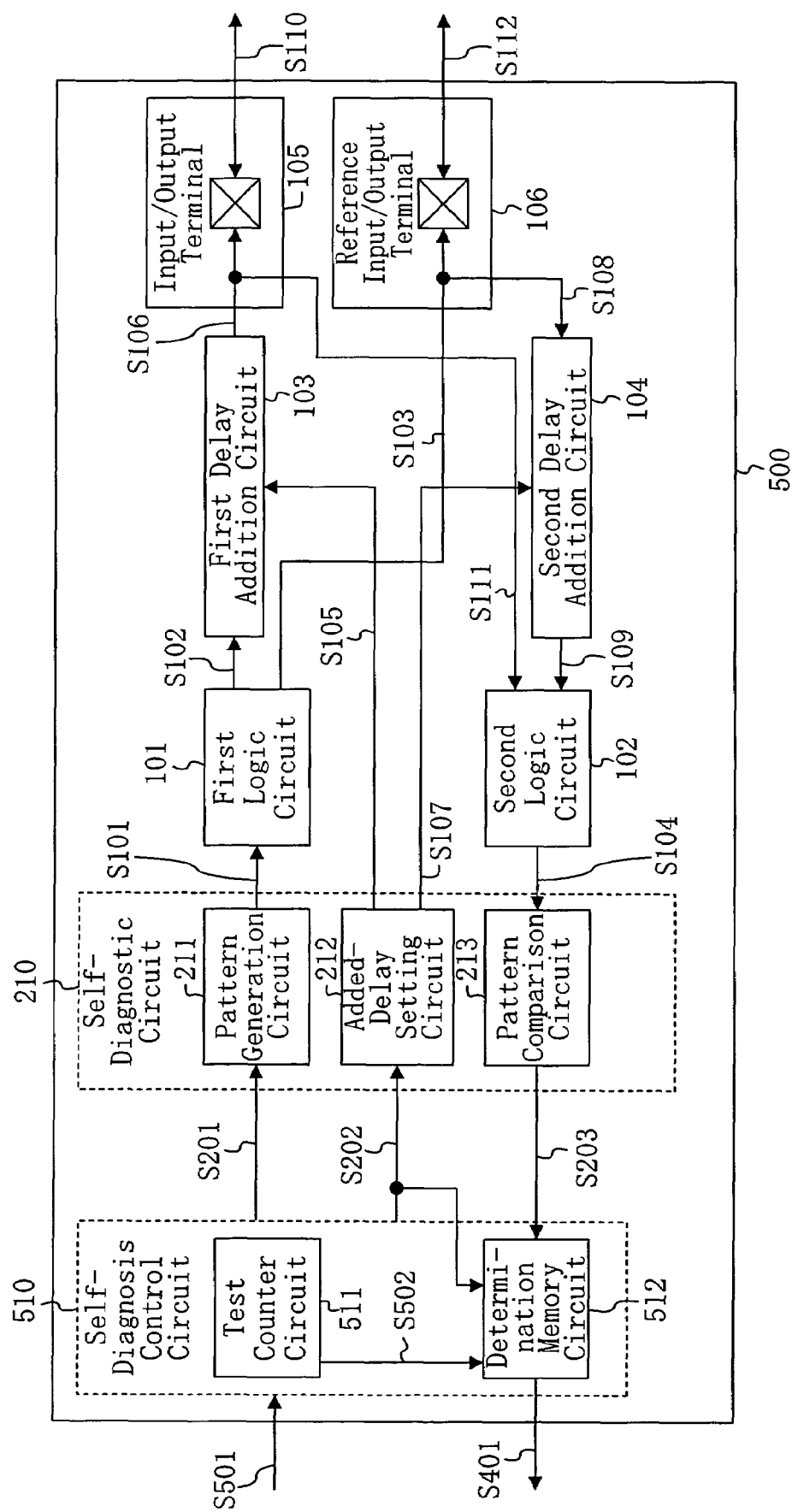
FIG. 5 is a block diagram showing a structure of a semiconductor integrated circuit according to a fifth embodiment of the present invention.

FIG. 5 is a block diagram showing a structure of a semiconductor integrated circuit 500 according to the fifth embodiment of the present invention. As shown in the drawing, the semiconductor integrated circuit 500 is constructed by replacing the self-diagnosis control circuit 310 according to the fourth embodiment with a self-diagnosis control circuit 510.

The self-diagnosis control circuit 510 comprises: a test counter circuit 511; and a determination memory circuit 512 and controls the self-diagnostic circuit 210 to allow the AC timing test to be performed a plurality of times under the same delay setting condition. The number of times that the determination is made under the same delay setting condition is inputted as a test number-of-times setting signal S501. The self-diagnosis control circuit 510 starts an operation when the test number-of-times setting signal S501 is inputted thereto.

A test counter circuit 511 counts the number of times that the test has been performed under the current delay setting condition and outputs a count value as a test number-of-times signal S502.

The determination memory circuit 512 stores the count value indicated by the test number-of-times signal S502 in conjunction with the result of the determination and the delay setting condition.

In the semiconductor integrated circuit 500 described above, an AC timing test is started when the test number-of-times setting signal S501 is inputted thereto from, e.g., an LSI tester or the like.

As a result, the self-diagnosis control circuit 510 outputs the delay setting signal S202 so that delays to be added by the first and second delay addition circuits 103 and 104 are set. Thereafter, the operation of testing the AC timing with the set delays and updating the value of the test counter circuit 511 is repeatedly performed till the value of the test counter circuit 511 reaches the number (which is, e.g., m) of times indicated by the test number-of-times setting signal S501. When the value of the test counter circuit 511 has reached m, next delays are set and the test is repeatedly performed m times under the condition of the set delays. Thus, the self-diagnosis control circuit 510 performs the operation of repeating the test m times under the setting of various added delays (e.g., all the delays that can be set).

Thus, according to the present embodiment, the number of times that the PASS/FAIL determination has been made in the AC timing test under the same delay setting condition can be checked by providing the test counter circuit 511. As a result, it becomes possible to evaluate a jitter in each of the reference input/output signal S112 and the input/output signal S110.

Embodiment 6

Figure 6:
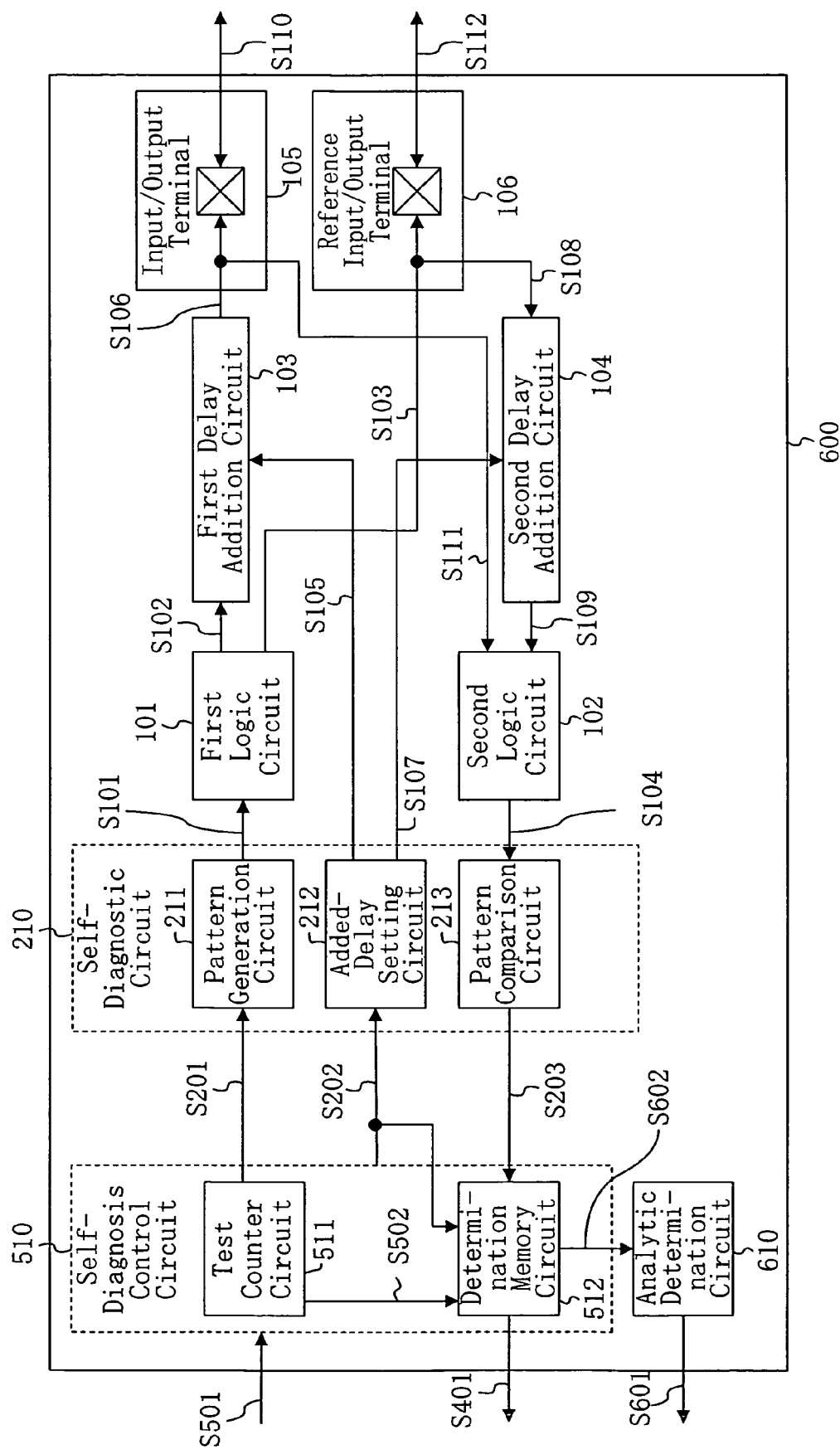
FIG. 6 is a block diagram showing a structure of a semiconductor integrated circuit according to a sixth embodiment of the present invention.

FIG. 6 is a block diagram showing a structure of a semiconductor integrated circuit 600 according to the sixth embodiment of the present invention. As shown in the drawing, the semiconductor integrated circuit 600 is constructed by further adding an analytic determination circuit 610 to the semiconductor integrated circuit 500 according to the fifth embodiment.

The analytic determination circuit 610 analyzes the range of a jitter from the result of self diagnosis in an AC timing test in the determination memory circuit 512, determines whether or not the jitter falls within the range in accordance with the specifications, and outputs the result of the determination. The range of the jitter is analyzed based on, e.g., the number of times that the PASS determination has been made in a specified range of set delay values. A jitter determination signal S601 shown in FIG. 6 indicates the result of the determination by the analytic determination circuit 610 and a data read signal S602 indicates the result of self diagnosis read from the determination memory circuit 512.

In the above-mentioned semiconductor integrated circuit 600 also, the AC timing test is performed a plurality of times under each setting of added delays and information on the number of times that the PASS/FAIL determination has been made under each setting of delays in the AC timing test is stored in the determination memory circuit 512.

The analytic determination circuit 610 acquires the PASS/FAIL information as the data read signal S602. As a result of performing the AC timing tests m times under the setting of various delays, if the respective numbers of times that the PASS determination has been made when the set delay ranges from t to (t+a), from (t+a+1) to (t+a+n), and from (t+a+n+1) to a larger value are zero, not less than 1 and not more than m, and m, it is analyzed that the range of the jitter is from the set delay (t+a+1) to the set delay (t+a+n). The analytic determination circuit 610 determines whether or not the result of the analysis is within the range in accordance with the specifications and outputs the result of the determination as the jitter determination signal S601 to the outside of the semiconductor integrated circuit 600.

Thus, according to the present embodiment, it becomes possible to make the PASS/FAIL determination in the jitter test by providing the analytic determination circuit 610.

Although each of the embodiments described above has performed the AC timing test on only the input/output terminal 105 relative to the reference input/output terminal 106, it will easily be appreciated that the AC timing test can also be performed by using the same circuit even when the number of input/output terminals is increased.

Although each of the embodiments described above has constructed the first logic circuit 101 such that it outputs different output signals to the first delay addition circuit 103 and to the reference input/output terminal 106, it is also possible to output the same signal to each of the first delay addition circuit 103 and the reference input/output terminal 106.

Thus, the semiconductor integrated circuit according to the present invention has the effect of allowing the AC timing test to be performed on each of an input signal and an output signal at the external input/output terminal by using an LSI tester which is lower in operating speed than the external input/output terminal and is therefore useful as a semiconductor integrated circuit comprising a circuit for testing and evaluating the AC timing of the external input/output terminal of the semiconductor integrated circuit.

What is claimed is:

1. A semiconductor integrated circuit comprising:
a first logic circuit for outputting an output signal in accordance with an operation pattern input signal;
a first delay addition circuit for delaying the output of the first logic circuit by an amount of delay in accordance with a first delay addition signal and outputting the delayed output;
an input/output terminal for outputting the output of the first delay addition circuit;
a reference input/output terminal for outputting the output of the first logic circuit;
a second delay addition circuit for delaying an inputted signal by an amount of delay in accordance with a second delay addition signal and outputting the delayed signal; and
a second logic circuit for outputting an operation pattern output signal in accordance with two input signals, wherein
the second delay addition circuit receives the output of the first logic circuit which has been looped back from the reference input/output terminal and the second logic circuit receives the output of the first delay addition circuit which has been looped back from the input/output terminal and receives the output of the second delay addition circuit.

2. The semiconductor integrated circuit of claim 1, further comprising:

a self-diagnostic circuit for generating the operation pattern input signal in response to a pattern generation start signal, receiving a delay setting signal indicative of a delay setting condition which is the respective amounts of delay to be added by the first delay addition circuit and the second delay addition circuit, generating the first delay addition signal and the second delay addition signal in accordance with the delay setting condition, determining whether or not the operation pattern output signal is a desired signal corresponding to the operation pattern input signal, and outputting a result of the determination.

3. The semiconductor integrated circuit of claim 2, further comprising: a self-diagnosis control circuit for generating the pattern generation start signal and the delay setting signal to control the self-diagnostic circuit such that the self-diagnostic circuit makes the determination under a plurality of the delay setting conditions.

4. The semiconductor integrated circuit of claim 3, wherein the self-diagnosis control circuit stores the results of the determination outputted from the self-diagnostic circuit in association with the delay setting conditions.

5. The semiconductor integrated circuit of claim 4, wherein the self-diagnosis control circuit controls the self-diagnostic circuit such that the self-diagnostic circuit makes the determination a specified number of times under the same delay setting condition.

6. The semiconductor integrated circuit of claim 5, further comprising; an analytic determination circuit for analyzing a range of a jitter based on a number of times that the operation pattern output signal has been the desired signal corresponding to the operation pattern input signal and on the delay setting condition, determining whether or not a result of the analysis falls within a specified range in accordance with specifications, and outputting a result of the determination.

* * * * *